United States Patent
Uno et al.

(10) Patent No.: US 9,427,830 B2
(45) Date of Patent: Aug. 30, 2016

(54) COPPER ALLOY BONDING WIRE FOR SEMICONDUCTOR

(75) Inventors: Tomohiro Uno, Tokyo (JP); Shinichi Terashima, Tokyo (JP); Takashi Yamada, Saitama (JP); Daizo Oda, Saitama (JP)

(73) Assignees: NIPPON STEEL & SUMIKIN MATERIALS CO., LTD., Tokyo (JP); NIPPON MICROMETAL CORPORATION, Iruma-Shi, Saitama (JP)

( * ) Notice: Subject to any disclaimer, the term of this patent is extended or adjusted under 35 U.S.C. 154(b) by 472 days.

(21) Appl. No.: 13/380,123

(22) PCT Filed: Jun. 23, 2010

(86) PCT No.: PCT/JP2010/060636
§ 371 (c)(1),
(2), (4) Date: Dec. 22, 2011

(87) PCT Pub. No.: WO2010/150814
PCT Pub. Date: Dec. 29, 2010

(65) Prior Publication Data
US 2012/0094121 A1    Apr. 19, 2012

(30) Foreign Application Priority Data
Jun. 24, 2009    (JP) .................................. 2009-150206

(51) Int. Cl.
| C22C 9/08 | (2006.01) |
| B32B 15/20 | (2006.01) |
| B23K 35/30 | (2006.01) |
| B21C 1/00 | (2006.01) |
| B21C 37/04 | (2006.01) |
| B23K 35/02 | (2006.01) |
| C22C 9/00 | (2006.01) |

(Continued)

(52) U.S. Cl.
CPC ............ *B23K 35/302* (2013.01); *B21C 1/003* (2013.01); *B21C 37/047* (2013.01); *B23K 35/0261* (2013.01); *C22C 9/00* (2013.01); *C22F 1/08* (2013.01); *H01L 24/43* (2013.01); *H01L 24/45* (2013.01); *H01L 24/48* (2013.01); *H01L 2224/05624* (2013.01); *H01L 2224/435* (2013.01); *H01L 2224/4321* (2013.01); *H01L 2224/43848* (2013.01); *H01L 2224/45015* (2013.01); *H01L 2224/4554* (2013.01); *H01L 2224/45144* (2013.01); *H01L 2224/45147* (2013.01); *H01L 2224/4851* (2013.01); *H01L 2224/48227* (2013.01); *H01L 2224/48247* (2013.01); *H01L 2224/48465* (2013.01); *H01L 2224/48507* (2013.01); *H01L 2224/48599* (2013.01); *H01L 2224/48624* (2013.01); *H01L 2224/48824* (2013.01); *H01L 2224/85181* (2013.01); *H01L 2924/01004* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01018* (2013.01); *H01L 2924/01022* (2013.01); *H01L 2924/01025* (2013.01); *H01L 2924/01027* (2013.01); *H01L 2924/01028* (2013.01); *H01L 2924/01029* (2013.01); *H01L 2924/01033* (2013.01); *H01L 2924/01045* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/01327* (2013.01); *H01L 2924/10253* (2013.01); *H01L 2924/15747* (2013.01); *H01L 2924/181* (2013.01); *H01L 2924/20751* (2013.01); *H01L 2924/20752* (2013.01); *H01L 2924/20755* (2013.01); *Y10T 428/2958* (2015.01)

(58) Field of Classification Search
CPC ... H01L 23/48; D02G 3/00; D01F 8/14–8/12
USPC .................................. 428/373; 257/762, E23
See application file for complete search history.

(56) References Cited

U.S. PATENT DOCUMENTS

2008/0061440 A1 *   3/2008   Uno et al. ..................... 257/762

FOREIGN PATENT DOCUMENTS

| JP | 59-139663 | A |   | 8/1984 |
| JP | 59139663 | A | * | 8/1984 |
| JP | 61-20693 | A |   | 1/1986 |

(Continued)

OTHER PUBLICATIONS

Full English translation of JP-59139663 A; Jul. 2015.*

(Continued)

*Primary Examiner* — Jennifer Chriss
*Assistant Examiner* — Ricardo E Lopez
(74) *Attorney, Agent, or Firm* — Troutman Sanders LLP

(57) ABSTRACT

The present invention is a copper-based bonding wire for use in a semiconductor element. The bonding wire of the present invention can be manufactured with an inexpensive material cost, and has a superior PCT reliability in a high-humidity/temperature environment. Further, the bonding wire of the present invention exhibits: a favorable TCT reliability through a thermal cycle test; a favorable press-bonded ball shape; a favorable wedge bondability; a favorable loop formability, and so on. Specifically, the bonding wire of the present invention is a copper alloy bonding wire for semiconductor manufactured by drawing a copper alloy containing 0.13 to 1.15% by mass of Pd and a remainder comprised of copper and unavoidable impurities.

8 Claims, No Drawings

(51) Int. Cl.
*C22F 1/08* (2006.01)
*H01L 23/00* (2006.01)

(56) References Cited

FOREIGN PATENT DOCUMENTS

| JP | 61-251062 A | 11/1986 |
| JP | 63-238233 A | 10/1988 |
| JP | 63-247325 A | 10/1988 |
| JP | 7-70673 A | 3/1995 |
| JP | 7-70675 A | 3/1995 |
| JP | 2008-85320 A | 4/2008 |
| JP | 2008-174779 A | 7/2008 |
| JP | 4-371538 B2 | 11/2009 |
| WO | WO-2008/069214 A1 | 6/2008 |
| WO | 2009/072525 A1 | 6/2009 |
| WO | WO-2009/072498 A1 | 6/2009 |

OTHER PUBLICATIONS

M. Deley, et al., The Emergence of High Volume Copper Ball Bonding, IEEE/CPMT/SEMI 29th International Electronics Manufacturing Technology Symposium, 2004, pp. 186-190.
Extended European Search Report issued in European Application No. 10792132.2 dated Nov. 7, 2012.

\* cited by examiner

COPPER ALLOY BONDING WIRE FOR SEMICONDUCTOR

CROSS REFERENCE TO PRIOR APPLICATIONS

This application is a U.S. National Phase application under 35 U.S.C. §371 of International Application No. PCT/JP2010/060636, filed on Jun. 23, 2010 and claims benefit of priority to Japanese Patent Application No. 2009-450206, filed on Jun. 24, 2009. The International Application was published in Japanese on Dec. 29, 2010 as WO 2010/150814 A1 under PCT Article 21(2). All these applications are herein incorporated by reference.

TECHNICAL FIELD

The present invention relates to a copper alloy bonding wire for semiconductor used to connect an electrode on a semiconductor element to a wiring on a circuit board.

BACKGROUND ART

Nowadays, a bonding wire connecting an electrode on a semiconductor element to an external terminal, is often a thin wire (bonding wire) having a wire diameter of about 20 to 50 μm. The bonding wire is generally bonded through a thermal compressive bonding technique with the aid of ultrasound. In such case, there are used, for example, a general bonding device and a capillary jig passing the bonding wire therethrough. A front end of the bonding wire is then heated and melted by means of an arc heat input, thereby forming a ball due to a surface tension. Subsequently, the ball thus formed is press-bonded to the electrode on the semiconductor element that has been heated at 150 to 300° C. Next, the bonding wire is directly wedge-bonded to an external lead side through an ultrasound compressive bonding.

As for a material of the bonding wire, there has been mainly employed a gold with a 4N purity (purity >99.99% by mass). However, due to, for example, the fact that gold is expensive and the fact that a thick wire (with a wire diameter of about 50 to 100 μm) is required in a power IC or the like, there has been demanded an bonding wire made of another metal that is inexpensive.

To meet demands from a wire bonding technique, it is desirable that the ball is formed with a favorable sphericity so that a bonded portion at which the ball is bonded to the electrode is formed into a shape as close to a true circle as possible, and that a sufficient bonding strength is required to be achieved. Further, as for a wedge bonding in which the bonding wire is press-bonded to a lead terminal or a wiring board with the aid of ultrasound, it is required, for example, that a continuous bonding takes place without an occurrence of a detachment or the like, and that a sufficient bonding strength is achieved to also adapt to, for example, a lowering of a bonding temperature and a thinning of the bonding wire.

As for a semiconductor such as an automotive semiconductor or the like that is often left at a high temperature, problems are often found in a long-term reliability of a bonded portion at which a gold bonding wire is bonded to an aluminum electrode. Failures such as a decrease in a bonding strength of the corresponding bonded portion and an increase in an electric resistance are observed through an accelerated test such as a high-temperature heating test or the like. Failures observed in a gold/aluminum bonded portion (the bonded portion at which the gold bonding wire is bonded to the aluminum electrode) at the high-temperature heating, become a limiting factor for the use of a semiconductor at a high temperature.

As disclosed, for example, in a non-patent document 1, a copper bonding wire made of copper is generally known to have the potential to improve a bonding reliability in an environment of high-temperature heating. It is pointed out one of the reasons for that is because a speed at which a Cu—Al based intermetallic compound grows in a copper/aluminum bonded portion (a bonded portion at which the copper bonding wire is bonded to the aluminum electrode) is as slow as or slower than ⅒ of a speed at which an Au—Al based intermetallic compound grows in the gold/aluminum bonded portion.

As disclosed, for example, in patent documents 1 through 3, the copper bonding wire is developed due to the fact that copper itself, for example, is inexpensive and has an electric conductivity higher than that of gold. However, a ball formed with the copper bonding wire is harder than that formed with the bonding wire made of Au, thus unfavorably causing damages such as cracks or the like on a chip when bonding a deformed ball to a pad electrode. Further, a wedge bonding performed with the copper bonding wire exhibits a production margin smaller than that of a wedge bonding performed with the bonding wire made of Au, thus resulting in concerns about a lower productivity. As described above, it has been confirmed that a favorable bonding reliability can be achieved with copper in the environment of high-temperature heating, though this may be problematic with Au. However, not enough is known about reliabilities of the copper bonding wire exposed to other severe conditions. In this sense, confirmations of and improvements in overall usability and reliability are required in terms of a practical use of the copper bonding wire.

PRIOR ART DOCUMENTS

Patent Documents

Patent document 1: Japanese Unexamined Patent Application Publication No. Sho 61-251062
Patent document 2: Japanese Unexamined Patent Application Publication No. Sho 61-20693
Patent document 3: Japanese Unexamined Patent Application Publication No. Sho 59-139663
Patent document 4: Japanese Unexamined Patent Application Publication No. 7-70673
Patent document 5: Japanese Unexamined Patent Application Publication No. Hei 7-70675

Non-Patent Document

Non-patent document 1: "The emergence of high volume copper ball bonding", M. Deley, L. Levine, IEEE/CPMT/SEMI 29th International Electronics Manufacturing Technology Symposium, (2004), pp. 186-190.

DISCLOSURE OF THE INVENTION

Problems to be Solved by the Invention

In terms of ensuring the overall reliability of the copper bonding wire for practical use, there have been performed a number of reliability evaluations so as to evaluate a long-term reliability of the copper bonding wire. Here, it was confirmed that while a normal result had been achieved in a high-temperature storage evaluation under a dry atmosphere, which is one of the most commonly used heating tests, failures had occurred in a high-humidity heating evaluation. A PCT test (pressure cooker test) is performed as a general high-humidity heating evaluation. Particularly, a type of PCT test performed in a saturated state is often employed to carry out a relatively strict evaluation. This type of PCI test is usually performed under a condition in which a temperature is 121° C., a relative humidity is 100% RH (Relative Humidity), and an atmospheric pressure is two. Since problems due to a wire material of the gold bonding wire are hardly observed in the PCT test, no attention has ever been placed on the PCT test involving the gold bonding wire (Au wire). Particularly, attentions have rarely been placed on a reliability, as measured in the PCT test, of the copper bonding wire in a developmental stage. In this way, failures observed in the PCT test were hardly known.

According to experiments carried out by the inventors of the present invention, there were observed failures including, for example, the decrease in the bonding strength and the increase in the electric resistance, through the type of PCT test performed in the saturated state, such PCT test being actually performed after resin-encapsulating a semiconductor with the copper bonding wire bonded thereto. Concerns in terms of practical use existed, because the failures were observed in 100 to 200 hours under the aforementioned heating condition. Since the copper bonding wire exhibits conductivity failures more frequently than the gold bonding wire does in the PCI test, it is required that a life of the copper bonding wire as measured in the PCI test be extended so as to allow the copper bonding wire to be used with the same uses as the gold bonding wire.

Further, other than the aforementioned reliability, it is also desired that a reliability with respect to a thermal cycle be improved, depending on a use of the bonding wire. In a thermal cycle test (TCT: Temperature Cycle Test) performed by increasing/decreasing a temperature, the copper bonding wire (Cu wire) was found to exhibit failures more frequently than the gold bonding wire did. Specifically, the TCT test evaluates, for example, the electric resistance and the bonding strength after repeatedly subjecting the bonding wire to a temperature cycle of −55 to 150° C. Here, the failures were mainly Observed in a second bonded portion. Assumably, the reason for that is because a breakage occurs in the second bonded portion of the bonding wire due to a thermal strain incurred by large differences in thermal expansion among materials including a resin, a lead frame, a silicon chip and the like. The gold bonding wire exhibits no problem when tested in the TCT test under a normal condition for semiconductor packaging and a normal usage environment. Assumably, the gold bonding wire may exhibit failures only when tested in the TCT test under extreme conditions including a modification in a peripheral member, a severe heating condition or the like. However, since the copper bonding wire exhibits failures in the TCT test more frequently than the gold bonding wire does, the copper bonding wire may have a limited use and a difficulty in adapting to various peripheral members. Accordingly, it is also required that the reliability with respect to the thermal cycle be improved in terms of obtaining a more superior copper bonding wire.

Another concern is that the copper bonding wire exhibits failures in a bonded shape formed by bonding the ball to the aluminum electrode, more frequently than the gold bonding wire does. As for a generally used gold bonding wire, developments have been made in forming a ball-bonded shape into a true circle in order to meet strict requirements of an LSI involving, for example, a fine pitch bonding. The copper bonding wire is oaten made of a high-purity copper for the purpose of for example, reducing chip damages underneath the bonded portion. A concern as a result of that is that the bonded shape may be deteriorated. Accordingly, it is also required that the ball-bonded shape, other than the aforementioned reliability, be further improved so that the copper bonding wire can be used more practically in, for example, the fine pitch bonding of the LSI.

There have been changes in characteristics of the copper bonding wire due to rapid advancements in the recent bonding techniques and packaging structures. Conventionally, the copper bonding wire was expected to be highly strengthened as the gold bonding wire would be. However, there has been put more emphasis nowadays on characteristics such as a softening, a bonding stability and the like of the copper bonding wire, for the purpose of pursuing mass productivity and improvements in the bonding techniques.

In order to solve the problems pertaining to the aforementioned conventional techniques, the present invention provides a copper alloy bonding wire for semiconductor, capable of improving a high-humidity heating reliability in a PCT test and mainly composed of copper which is less expensive than gold composing a gold bonding wire.

Means to Solve the Problems

The copper alloy bonding wire for semiconductor according to a first aspect is manufactured by wire drawing of a copper alloy; in which the copper alloy contains 0.13 to 1.15% by mass of Pd, and a remainder comprised of copper and unavoidable impurities.

The copper alloy bonding wire for semiconductor according to a second aspect is the one set forth in the first aspect, in which a copper oxide formed on a surface thereof has an average film thickness of 0.0005 to 0.02 μm.

The copper alloy bonding wire for semiconductor according to a third aspect is the one set forth in the first aspect and the second aspect, and comprises crystal grains not smaller than 2 μm and not larger than a wire diameter multiplied by 1.5 on average, such crystal grains being observed on a wire cross-section surface parallel to a wire longitudinal direction.

The copper alloy bonding wire for semiconductor according to a fourth aspect is the one set forth in any one of the first aspect through the third aspect, in which the copper alloy further contains at least one of Ag and Au in a total amount of 0.0005 to 0.07% by mass.

The copper alloy bonding wire for semiconductor according to a fifth aspect is the one set forth in any one of the first aspect through the fourth aspect, in which the copper alloy further contains at least one of Ti: 0.0005 to 0.01% by mass, B: 0.0005 to 0.007% by mass and 0.0005 to 0.02% by mass, in a total amount of 0.0005 to 0.025% by mass.

Effects of the Present Invention

The present invention provides a copper alloy bonding wire for semiconductor, made of inexpensive materials and exhibiting a superior long-term reliability in a bonded portion when heated at a high humidity. Further, the copper alloy bonding wire of the present invention exhibits a superior reliability in a thermal cycle. Furthermore, the copper alloy bonding wire of the present invention allows a favorable deformation of a ball, and is superior in a mass productivity.

MODE FOR CARRYING OUT THE INVENTION

After earnestly exploring an impact of an element contained in a copper bonding wire, it was found through a PCT test that a high-humidity heating reliability of the copper bonding wire could be improved by adding thereto a given amount of Pd. According to copper bonding wires disclosed in Patent document 4 and Patent document 5, elements including Pd are added thereto so as to control generations of an $H_2$ gas, an $O_2$ gas, an $N_2$ gas and a CO gas at the time of forming balls. However, such elements including Pd are actually added in a wide range of 0.001 to 2% by mass. Patent documents 4 and 5 neither describe nor suggest a wholly different effect of improving high-humidity heating reliabilities of the copper bonding wires by adding Pd in a given range proposed by the present invention.

Further, it was found that a deformed ball-shape could be improved by adding a given amount of Ag and Au along with Pd (partially displacing a remaining copper with a given amount of Ag and Au), and that a thermal cycle reliability measured in a TCT test could be improved by adding a given amount of Ti, B and P along with Pd (partially displacing the remaining copper with a given amount of Ti, B and P) Further more, it was confirmed that a wedge bondability could also be improved by adding the aforementioned Pd and ensuring a given structure.

The present invention is a copper alloy bonding wire for semiconductor composed of a copper alloy containing Pd in a concentration range of 0.13 to 1.15% by mass. The high-humidity heating reliability measured in the PCT test can be improved by adding Pd the aforementioned concentration range. Particularly, since the bonding wire of the present invention contains Pd in the corresponding concentration range, a life thereof before exhibiting failures in the PCT test is 1.3 to 3 times longer than those of the conventional copper bonding wires. In this way, the copper bonding wire of the present invention has the same uses as a gold bonding wire. Namely, purposes of use of copper bonding wires can be expanded more than ever.

As failures observed in the PCT test performed on a semiconductor to which a conventional copper bonding wire is bonded, there have been known: a decrease in a strength of a bonded portion at which the copper bonding wire is bonded to an aluminum electrode; and an increase in an electric resistance. The inventors of the present invention found that those failures were mainly caused by a corrosion reaction on a Cu/Al bonded interface (bonded interface between the copper bonding wire and the aluminum electrode). Specifically, this is mainly due to the fact that a Cu—Al based intermetallic compound grown on the bonded interface during the PCT test, develops a corrosion reaction with gas components, ions or the like contained in an encapsulation resin. According to the copper alloy bonding wire for semiconductor of the present invention, Pd contained in the copper bonding wire in the aforementioned concentration range diffuses to and is then concentrated in the bonded interface, thereby conceivably affecting an interdiffusion between Cu and Al and delaying the aforementioned corrosion reaction. Here, Pd in the vicinity of the bonded interface conceivably serves as a barrier inhibiting a movement of a corrosion reactant, and as a controller controlling, for example, the interdiffusion between Cu and Al and the growth of the Cu—Al based intermetallic compound.

When a Pd concentration is 0.13 to 1.15% by mass, there can be achieved the effect of controlling the interdiffusion between Cu and Al on the bonded interface, and a life of the bonded portion increases to 200 hours or longer in the PCT test. The bonded portion is evaluated as follows. Specifically, the aforementioned resin is unsealed and removed after the PCT test so as to evaluate a breaking status of the bonded portion through a pull test. Here, when the Pd concentration is less than 0.13% by mass, the aforementioned effect in terms of improving a PCT reliability is small and insufficient. Meanwhile, when the Pd concentration is greater than 1.15% by mass, an initial bonding strength as a result of bonding to the aluminum electrode at a low temperature decreases, thus causing a long-term reliability in the PCT test to decrease, and resulting in a small mass production margin if bonding to, for example, a substrate such as a BGA (Ball Grid Array), CSP (Chip Size Package) or the like, or a tape. The Pd concentration is more preferably 0.2 to 1.1% by mass so that the PCT reliability can be further improved. Particularly, the bonded portion can thus last for 500 hours or longer before failures occur, which is as many as or more than 1.5 times longer than the conventional copper bonding wires can last, thus indicating that the bonding wire of the present invention can be used even in a rough condition.

Further, Pd, when added in high concentration, actually needs to be added in a manner such that a performance of the copper alloy bonding wire for semiconductor is not degraded. When the Pd concentration is greater than 1.15% by mass, a normal-temperature strength and a high-temperature strength of the bonding wire increase, thus resulting in a noticeable variation in loop shapes and a noticeable decrease in the wedge bondability. In this sense, as long as the Pd concentration is 0.13 to 1.15% by mass, there can also be easily ensured a favorable wedge bondability, a less noticeable variation in loop heights, or the like.

When the copper alloy bonding wire for semiconductor is composed of the copper alloy containing Pd in the concentration range of 0.13 to 1.15% by mass, Pd is caused to substantially evenly dissolve even in a ball formed by melting a front end of the corresponding copper alloy bonding wire, thus making it possible to stably improve the PCT reliability at a mass production level. Conceivably, Pd inside the ball serves to delay a diffusion of a corrosive ion therein, and inhibit a movement of a corrosive gas by improving an adhesion on the bonded interface. Further, Pd inside the ball also conceivably serves as a supply source allowing Pd to be diffused to the bonded interface from within the aforementioned ball. Here, an improvement in the PCT reliability at the mass production level, as far as a high-density packaging is concerned, is achieved by: a stable manner of control producing no failure in the bonded portion of even only one pin out of multiple pins that are as many as 300 to 1800 per chip; or a strict manner of control restricting corrosion even in a region of a few micrometers on a small bonded interface to which a ball having a diameter of 45 μm or smaller is press-bonded. Such a kind of significant improvement in the reliability is also due to the fact that Pd is dissolved in the ball.

When Pd is contained in the ball by 0.08 to 1.5% by mass, a PCT bonding reliability can be more effectively improved at the mass production level in a stable manner. Here, an appropriate range of a Pd content in the ball slightly deviates from that in the wire. This is due to a manner of concentration distribution of Pd. Specifically, it is due to the fact that Pd is concentrated on a surface of and eccentrically concentrated inside the ball as a result of a partial diffusion thereof as the wire is melted and then solidified, and the fact that Pd is diffused in the vicinity of the bonded interface as a result of performing heating in a resin encapsulation procedure, reliability tests or the like after bonding is completed. Namely, as long as the copper alloy bonding wire for semiconductor contains thereinside 0.13 to 1.15% by mass of Pd, it is easy to allow the ball to contain Pd in the appropriate range of 0.08 to 1.5% by mass, thus more effectively improving the reliability in a stable manner.

The PCT reliably at the mass production level can be further improved in a stable manner, if the copper alloy bonding wire for semiconductor is composed of the copper alloy containing 0.13 to 1.15% by mass of Pd, and an average film thickness of a copper oxide formed on a surface of the corresponding bonding wire is 0.0005 to 0.02 μm. When a film thickness of the copper oxide on the wire surface is greater than 0.02 μm, a variation is observed in the improvement in the PCT reliability of a ball-bonded portion of the bonding wire composed of the copper alloy containing Pd, such variation often leading to an unstable bonding strength or the like after heating is performed in the PCT test. Such a kind of variation in the PCT reliability can be even more problematic when the bonding wire has a wire diameter of 20 μm or smaller. Although it has not yet been made completely clear as to how the copper oxide on a surface of the copper alloy containing Pd leads to an unstable PCT reliability, it is assumed that an unstable PCT reliability is brought about by: an uneven Pd concentration distribution observed in a longitudinal direction of the copper alloy bonding wire for semiconductor and in a depth direction from the wire surface; or an invading oxygen or residual oxides inside the ball that are expected to inhibit Pd from improving the PCT reliability. Further, an effect of delaying surface oxidation can also be achieved with the copper alloy bonding wire for semiconductor containing Pd, thus making possible to easily keep the average film thickness of the copper oxide in a thin range of 0.0005 to 0.02 μm. As compared to a bonding wire composed of a high-purity copper, it was confirmed that the copper alloy bonding wire for semiconductor containing 0.13 to 1.15% by mass Pd was capable of delaying a growth of a copper oxide film on the wire surface, in a low temperature range of about 20 to 40° C.

The reason that the average film thickness of the copper oxide on the wire surface is set to be 0.0005 to 0.02 μm is because when the film thickness is greater than 0.02 μm, a variation in the improvement in the PCT reliability occurs, as mentioned earlier. Particularly, such variation occurs when there are more bonded portions to be evaluated, and the PCT reliability is more likely to be improved in an unstable manner at that time. Meanwhile, a special method of surface treatment, a special method of product control or the like is required to stably keep the average film thickness of the copper oxide on the wire surface in a range of under 0.0005 μm, such special methods causing a bondability to decrease and a cost to increase, and thus making it difficult for the bonding wire to be used industrially. For example, when an applied-film of a rust-preventive agent on the wire surface is thickened so as to keep the average film thickness of the copper oxide in the range of under 0.0005 μm, both the bonding strength and a continuous bondability decrease. Further, when a guaranteed life of a wire product stored in the atmosphere is extremely shortened so as to keep the average film thickness of the copper oxide in the range of under 0.0005 μm, operations for manufacturing the bonding wire in mass production lines become difficult, and issues regarding scrap are raised accordingly, thereby possibly making the corresponding bonding wire unacceptable in terms of industrial use.

Auger spectroscopy analysis suitable for a surface analysis is effective in terms of measuring the average film thickness of the copper oxide on the wire surface. Here, it is desired that an average value of the film thickness of the copper oxide be used, such film thickness being measured in at least three or five, if possible, random locations on the wire surface. An oxygen concentration refers to a ratio of oxygen to a sum total of Cu, oxygen and metallic elements. An amount of C is not considered in the aforementioned concentration calculation, since organic substances typically contaminating the wire surface are removed. Further, since it is difficult to obtain an absolute value of the film thickness of the copper oxide with a high degree of accuracy, it is desired that an $SiO_2$ equivalent commonly used in the Auger spectroscopy analysis be used to calculate the film thickness of the copper oxide. In this specification, an oxygen concentration of 30% by mass was regarded as a borderline between the copper oxide and the copper. Some of the main copper oxides include $Cu_2O$ and $CuO$. Here, $Cu_2O$ is most likely to be preferentially formed on the surface of the copper alloy containing Pd, at a low temperature (25 to 50° C.), thus causing the oxygen concentration of 30% by mass to be the borderline.

Oxidation during a wire manufacturing process needs to be controlled in order to keep the average film thickness of the copper oxide on the wire surface in the range of 0.0005 to 0.02 μm, at the mass production level. The formation of the copper oxide during a heat treatment can be effectively controlled by controlling, for example, a temperature (200 to 850° C.), a rate at which an inert gas is flowed (1 to 8 L/min) and an oxygen concentration inside a furnace. Specifically, such oxygen concentration has to be measured in a midsection of the furnace and kept in a range of 0.1 to 6% by volume. The oxygen concentration can be kept in the aforementioned range by optimizing the rate at which an inert gas is flowed, and modifying a shape of an entrance, an exit or the like of the furnace so as to prevent the atmosphere from entering the corresponding furnace from the outside. Further, it is also desired that a number of controls be performed during a drawing procedure, such controls including, for example, drying (with a hot air of 40 to 60° C. blown thereto) an unwound bonding wire that has been drawn in one pass in the water so as to voluntarily remove water on the surface thereof, and controlling a humidity at which the bonding wire is stored in mid-course of the wire manufacturing process (a relative humidity of 60% or lower when stored for two days or longer).

It is more desirable that the copper alloy bonding wire for semiconductor not only contains 0.13 to 1.15% by mass of Pd, but also has crystal grains not smaller than 2 μm and not larger than 75 μm on average (number average), such crystal grains being formed on a wire cross-section surface parallel to a longitudinal direction of the corresponding bonding wire (referred to as "wire longitudinal direction" hereunder). When those crystal grains are not smaller than 2 μm on average, a crystal orientation anisotropy, for example, can be reduced, and a softening of the copper alloy bonding wire for semiconductor can be facilitated. As a result, there can be achieved a further stabilized loop shape and an improved wedge bondability. Specifically, there can be stably formed in a controlled manner a complex loop shape in four directions independently from a bonding direction, by controlling a bending and plastic deformation of the copper alloy bonding wire for semiconductor. Further, a packaging yield can also be improved by reducing a type of non-stick failure observed in a wedge bonding process (Non-Stick-On-Lead: NSOL). There have been changes in characteristics of the copper bonding wire due to rapid advancements in the recent bonding techniques and packaging structures. Conventionally, the copper bonding wire was expected to be highly strengthened as a gold bonding wire would be. However, there has been put more emphasis nowadays on the softening, a bonding stability or the like. In order to adapt to the latest packaging structures, the copper bonding wire containing Pd has to have a highly-strengthened property thereof restrained, and the crystal grains with an enlarged average size so that a loop control and the wedge bondability can be further improved. Particularly, the aforementioned effects can be fully achieved if the crystal grains are not smaller than 2 μm on average. The copper bonding wire thus configured can be fully applied even to the latest packaging involving, for example, a multiple bonding featuring loops with different heights. A conventional and general gold bonding wire has a fibrous texture and crystal grains smaller than 1 μm on average. Since the copper bonding wire containing Pd is more likely to possess refined crystal grains, there is a concern regarding a decrease in a yield in a bonding procedure. However, by coarsening the corresponding crystal grains and allowing the copper bonding wire to contain Pd, there can be achieved a more beneficial effect of further improving both the loop control and the wedge bondability. Preferably, when the crystal grains are not smaller than 3 μm on average, there can be achieved an effect of further improving the wedge bondability, such effect being mainly and particularly noticeable in a thin bonding wire with a wire diameter of 20 μm or smaller. Here, although there is no upper limit to the average size of the crystal grains as far as achieving the aforementioned effects is concerned, an upper limit of 75 μm was imposed on the copper alloy bonding wire for semiconductor from the perspective of productivity. This upper limit is equivalent to or less than a value 1.5 times larger than a wire diameter of 50 μm of the copper alloy bonding wire for semiconductor. When the bonding wire is a thin wire having a wire diameter of 25 μm or less, it is desired that the upper limit of the average size of the crystal grains be 1.5 times larger than the corresponding wire diameter or less. When such upper limit is exceeded, the crystal gains are excessively coarsened and form a bamboo structure accordingly. In this case, the wire diameter may be locally thinned during the wire manufacturing process, and a low productivity may thus be resulted. Here, grain sizes of the crystal grains in the present invention are determined as follows.

An observation on the crystal grains of the copper alloy bonding wire for semiconductor, can be carried out by observing the wire cross-section surface (axis cross-section surface) in the wire longitudinal direction along a wire axis. Preferably, the observation on the axis cross-section surface allows an overall structure of the copper alloy bonding wire for semiconductor to be observed, including an interior section thereof.

Conditions of the drawing procedure and the heat treatment need to be appropriately adjusted in order to stably manufacture, at the mass production level, the copper alloy bonding wire for semiconductor containing 0.13 to 1.15% by mass of Pd and having the crystal grains not smaller than 2 μm and not larger than the wire diameter multiplied by 1.5 on average, such crystal grains being observed on the wire cross-section surface parallel to the wire longitudinal direction. An extra-thin wire with a wire diameter of 20 μm can be manufactured, for example, through: a drawing procedure in which a reduction rate is 99.99% or higher, and an average drawing rate is 200 to 400 m/min; and also a heat treatment in which a heat-treating furnace with a soaking area of 200 mm is used, a temperature thereof is 400 to 800° C., a dragging rate is 20 to 100 m/min and an inert gas is flowed at a rate of 0.5 to 6 L/mm. Under such conditions, there can be industrially easily formed the crystal grains not smaller than 2 μm and not larger than the wire diameter multiplied by 1.5 on average, without decreasing a productivity of the extra-thin wire with a severe quality stability. Preferably, it is desired that the heat treatment (at a temperature of 300 to 600° C. under the aforementioned conditions) be performed at least once in mid-course of the drawing procedure when the reduction rate is 99.5 to 99.99%. This is because a variation in the crystal grain diameters when a final wire diameter has been reached, can be reduced by partially allowing a restoration and recrystallization in the copper alloy with Pd dissolved therein.

The sizes of the crystal grains are actually measured by first identifying grain boundaries (boundaries among crystal grains) as flows so as to clarify shapes of the corresponding crystal grains in the beginning. Specifically, the grain boundaries are identified by: directly observing the grain boundaries through chemical etching or Cross-section Polishing (CP); or analyzing the grain boundaries based on Electron Back Scattering Patterns (EBSP). Chemical etching allows a structure formed by the crystal grains or the like to be easily observed, when there are selected a chemical solution and etching conditions that are suitable for a material, a structure or the like of either a surface skin layer or a core material. The aforementioned chemical solution may be, for example, an acid aqueous solution of hydrochloric acid, nitric acid, sulfuric acid, acetic acid or the like. The etching conditions including an acid concentration (pH), a temperature, a time or the like are then selected so as to selectively dissolve the grain boundaries and specific crystal faces, thereby identifying the grain boundaries, and thus making it possible to observe the shapes of the crystal grains. CP allows there to be formed a sample cross-section surface, using, for example, a broad beam of argon ion with an accelerating voltage of 2 to 6 kV, thereby identifying the grain boundaries and allowing the shapes of the crystal grains to be observed accordingly. EBSP allows orientations of each crystal grains to be measured, thus making it possible to identify the grain boundaries. In the present invention, a grain boundary is defined as where a misorientation between adjacent crystal grains is as large as or larger than 15°.

The average size of the crystal grains is calculated as a number average value. Sizes of at least five crystal grains are averaged here. Further, in the present invention, it is unnecessary to perform all the aforementioned analytical methods to make sure that the average crystal grain size obtained therethrough falls in a stipulated range of the present invention. As a matter of fact, it is sufficient that the average crystal grain size obtained through one of such analytical methods falls in the stipulated range.

The sizes of the crystal grains can be determined by analyzing photographs taken through a microscope, Scanning Electron Microscope (SEM), EBSP or the like, or using an analysis software. When the crystal grains are found to have irregular shapes other than circular shapes in the photo analyzing process, a larger diameter and a smaller diameter of each crystal grain can be measured so as to obtain an average value thereof. As for the latter, an analysis software or the like installed in an EBSP device can be used, thereby making it possible to simultaneously carry out the observation and obtain the aforementioned average value with a relative ease.

It is more desirable that the copper alloy bonding wire for semiconductor contains 0.13 to 115% by mass of Pd, and at least one of Ag and Au in a total amount of 0.0005 to 0.07% by mass. A deformed shape of the ball-bonded portion has become crucial when performing a fine pitch bonding as required in the recent high-density packaging. Particularly, it is required that a bonded ball be formed into a true circle by restricting an irregular shape such as a petal shape, a core deviation shape or the like. Pd along with at least one of Ag and Au contained in the bonding wire allows the ball to be isotropically deformed with an ease, thus more effectively improving a roundness of a press-bonded shape. Here, it was confirmed that the corresponding type of bonding wire could also be reliably used in a fine pitch bonding of 50 μm or finer. Particularly, it was confirmed that although elements such Ag and Au along were not effective enough in terms of forming the bonded ball into a true circle, such effect could be further improved by combining Pd thereinto. Although unclear on a detailed mechanism thereof, it is assumed that Pd known as a high-melting-point metal is relatively highly concentrated in the vicinity of a ball surface as the ball is being solidified, whereas Ag and Au having melting points lower than that of Pd are evenly dissolved even in an interior of the ball at that time, thereby bringing about a mutually complementary mechanism, and thus allowing the bonded ball to be more effectively formed into a true circle. Here, as an example of the mutually complementary mechanism, it is expected that both the petal shape and the core deviation shape be resolved, such petal shape being dominant in the vicinity of the ball surface of the ball, whereas such core deviation shape being dominant inside the ball. Further, it was confirmed that Ag and Au were equally effective. Here, when a concentration of at least one of Ag and Au is less than 0.0005% by mass, the bonded ball may be less effectively formed into a true circle with an ease. When the corresponding concentration is greater than 0.07% by mass, a shear strength of the ball-bonded portion may decrease. Further, without Pd (though resulting in an unsatisfactory reliability in a high-humidity heating). Ag and Au along contained in the bonding wire are not effective enough in terms of forming the bonded ball into a true circle. As a matter of fact, such effect cannot be sufficiently achieved unless the concentration of at least one of Ag and Au is as high as or higher than 0.2% by mass. Namely, the bonded ball can be noticeably effectively formed into a true circle, when there are added Pd and at least one of Ag and Au. Further, when there is contained Pd along with at least one of Ag and Au, there can be achieved a synergistic effect of sufficiently restricting a negative impact such as a chip damage or the like even if the concentration of at least one of Ag and Au is low.

Furthermore, the bonded ball can be highly effectively formed into a true circle when the copper alloy bonding wire for semiconductor contains: 0.13 to 1.15% by mass of Pd; at least one of Ag and Au in a total amount of 0.0005 to 0.07% by mass; and the crystal grains not smaller than 2 μm, such crystal grains being observed on the wire cross-section surface parallel to the wire longitudinal direction. Although unclear on certain portions of a mechanism thereof, it is assumed that a tail cut portion having a stabilized shape due to the enlarged crystal grains is formed after performing a wedge bonding, such tail cut portion being later melted through arc discharge so as to form a ball of a uniform structure. This effect of forming a true circle is particularly noticeable in the copper alloy bonding wire for semiconductor having the wire diameter of 20 μm or smaller.

It is more desirable that the copper alloy bonding wire for semiconductor be composed of a copper alloy containing: 0.13 to 1.15% by mass of Pd; and at least one of Ti: 0.0005 to 0.01% by mass, B: 0.0005 to 0.007% by mass and P: 0.0005 to 0.02% by mass, in a total amount of 0.0005 to 0.025% by mass. When there are added Pd and at least one of such Ti, B and P, there can be achieved a high effect of reducing failures in a wedge-bonded portion that occur in a thermal cycle test such as the TCT test or the like. When there are added Ti, B and P, a work hardening of the bonding wire being largely deformed is reduced, thereby more effectively facilitating a wire deformation in the wedge bonding. Further, these elements are also expected to control damages such as microcracks or the like on the copper alloy bonding wire for semiconductor that has been wedge-bonded, even if the corresponding bonding wire has been either elongated or contracted due to a thermal strain in the TCT test. It was confirmed that the reliability measured in the TCT test was only slightly improved when there were added only elements including Ti, B and P, but was further improved when there was added Pd along with the corresponding elements. Although unclear on a detailed mechanism thereof, it is assumed that Pd is dissolved in Cu, and Ti, B and P are precipitated and segregated due to small solid solubilities thereof in Cu, thereby causing the corresponding elements to complementarily act on one another and bringing about a further superior effect on the wire deformation in the wedge bonding. Here, the aforementioned effect may be low, when a lower limit of the concentration of at least one of Ti, B and P is less than 0.0005% by mass. Further, when upper limits of the concentrations of Ti, B and P are greater than 0.01% by mass, 0.007% by mass and 0.02% by mass, respectively, or when the sum total of at least one of such Ti, B and P accounts for more than 0.025% by mass, a wire strength increases, whereas a linearity of a trapezoidal loop decreases, thereby possibly narrowing an interval between adjacent copper alloy bonding wires for semiconductor.

It is more desirable that the copper alloy bonding wire for semiconductor contains: 0.13 to 1.15% by mass of Pd; and at least one of Ti: 0.0005 to 0.01% by mass, B: 0.0005 to 0.007% by mass and P: 0.0005 to 0.02% by mass, in a total amount of 0.0005 to 0.025% by mass; and the crystal grains not smaller than 2 μm, such crystal grains being observed on the wire cross-section surface parallel to the wire longitudinal direction. This copper alloy bonding wire for semiconductor allows there to be achieved a higher effect of improving the wedge bondability. Assumably, this is due to the fact that the reliability measured in the TCT test is further improved as a result of a mutual interaction between the coarsening of the crystal grains and the effects of the aforementioned elements, such elements being added to reduce the damages on the wedge-bonded portion that are caused by the thermal strain. This improvement is particularly noticeable when the bonding wire is a thin wire having the wire diameter of 20 μm or smaller.

The copper alloy bonding wire for semiconductor of the present invention is stored: either with a normal anticorrosive applied thereto; or in a manner such that the bonding wire is actually sealed in an inert atmosphere composed of an $N_2$ gas or the like; or under both conditions. The copper alloy boning wire for semiconductor of the present invention can be used as it is (as a monolayer wire) and still allows there to be achieved the aforementioned effects, without, for example, coating or plating the wire surface other than applying the anticorrosive thereto for storage purpose.

There is described hereunder an overview of a manufacturing method of the copper alloy bonding wire for semiconductor of the present invention.

At first, a copper alloy made by melting (fusing) a copper alloy composed of a high-purity copper with a purity of 4N to 6N (99.99 to 99.9999% by mass) and containing additive elements at a required concentration. This type of alloying is completed by either directly adding the additive elements with high purities, or utilizing a master alloy containing the additive elements at a concentration as high as about 1%.

The utilization of the master alloy is effective in terms of allowing the additive elements to be contained at a low concentration and evenly distributed. As far as the additive elements in the present invention are concerned, Pd with a high purity can be directly added if Pd itself is to be contained at a relatively high concentration of 0.5% or higher by mass, whereas the master alloy is added if elements including Pd, Ag, Au, Ti, B, P and the like are to be stably contained at low concentrations. The copper alloy is heated and melted at 1100° C. or higher under vacuum, a nitrogen gas atmosphere or an Ar gas atmosphere. The copper alloy thus melted is then slowly cooled in a furnace so as to manufacture an ingot. Such ingot is then washed with acid and water so as to wash a surface thereof, followed by drying the ingot thus washed. An Inductively Coupled Plasma (ICP) analysis or the like is effective in terms of analyzing the concentrations of the additive elements in the copper.

The bonding wire with a large diameter is then manufactured through a rolling procedure, whereas the bonding wire with a small diameter is manufactured through a drawing procedure in which the wire diameter is made as thin as a final wire diameter. A groove rolling device or a swaging device is used to perform the rolling procedure. As for the drawing procedure, there is used a continuous drawing device to which a plurality of diamond coated dies can be attached. If necessary, a heat treatment is performed in mid-course of such processing procedures or when the wire diameter has reached the final diameter. As for the manufacturing procedures of the copper alloy bonding wire for semiconductor, it is desired that the processing procedures and the heat treatment be performed appropriately in order to form a metallographic structure in which the crystal grains not smaller than 2 μm on average are found on the wire cross-section surface parallel to the wire longitudinal direction. Specifically, it is desired that the heat treatment be performed twice or more. For example, there can be employed a process annealing performed in mid-course of the drawing procedure, and a finishing annealing performed when the wire diameter has reached the final wire diameter through the drawing procedure. In this way, the sizes of the crystal grains can be stably controlled. The sizes of the crystal grains can be effectively modified by adjusting, for example: the wire diameter at the time of performing the process annealing; a heating condition under which the process annealing is performed; processing conditions in the drawing procedure before and after the process annealing; and a heating condition under which the finishing annealing is performed. The fact that Pd is contained by 0.13 to 1.15% by mass makes it relatively easier for a lattice defect such as a dislocation, an atomic vacancy or the like to occur in the processing procedures, and for recrystallized grains to be formed with a core of the lattice defect in the heat treatment. When the processing procedures and the heat treatment are performed under appropriate conditions, Pd dissolved in Cu and the aforementioned lattice defect are caused to complementarily act on one another, thereby allowing a processed texture and a recrystallized texture to be controlled, thus making it possible to adjust the sizes of the crystal grains.

WORKING EXAMPLES

Working examples of the present invention are described hereunder.

A specific manufacturing process is described hereunder. There was used a high-purity copper with a purity of 4N to 6N (99.99 to 99.9999% by mass). Elements required were then added to such high-purity copper, followed by melting a copper alloy thus obtained at 1100° C. or higher under vacuum, a nitrogen gas atmosphere or an Ar gas atmosphere. The copper alloy thus melted was then slowly cooled in a furnace, thus manufacturing an ingot with a diameter of 6 to 30 mm. Such ingot was then washed with acid and water so as to wash a surface thereof, followed by drying the ingot thus washed. An ICP device was then used to analyze microelements in the copper, i.e., a concentration of elements in a copper alloy.

A bonding wire of a large diameter was then manufactured by performing a rolling procedure, whereas a bonding wire of a small diameter was manufactured by performing a drawing procedure. The bonding wire of a small diameter actually had a thin final wire diameter of either 25 μm or 18 μm, through the drawing procedure. A groove rolling device was used to perform the rolling procedure. Here, the rolling procedure was performed at a rate of 10 to 100 m/min until there was obtained a wire diameter of 0.5 to 1.5 mm. As for the drawing procedure, there was used a continuous drawing device to which a plurality of dies could be attached, and dies coated with diamond. The drawing procedure was performed at a drawing rate of 50 to 400 m/min. Here, inner walls of the dies had already been cleaned before use, through ultrasonic cleaning.

Further, there were performed heat treatments for two to four times during the aforementioned procedures. Particularly, an intermediate heat treatment was performed for one to three times while a wire diameter was 500 to 40 μm. And, a final heat treatment was performed once as the wire diameter had reached a final wire diameter. An infrared furnace having a soaking area of 10 cm or longer and a temperature of 250 to 800° C. was used to perform a heat treatment in which a wire was continuously moved in the corresponding furnace at a rate of 10 to 500 m/min and with a dragging tensile force of 2 to 30 mN. In order to control copper oxidation on a wire surface, an inert gas (a nitrogen gas of 4N purity) was continuously flowed into the furnace at a rate of 0.5 to 5 L/min. As a standard for controlling a formation of a copper oxide on the wire surface, a value of an oxygen concentration measured in a midsection of the furnace was adjusted to 0.1 to 6% by volume. Specifically, a commercially available galvanic cell type oxygen sensor was used to measure the oxygen concentration. Further, an elongation rate of a wire with a final wire diameter was adjusted to 4 to 25%, such elongation rate being measured in a tensile test. If necessary, an anticorrosive was applied to the wire surface, and a protection bag was used at the time of storage to cover a spool around which a copper alloy bonding wire for semiconductor was wound, such protection bag being sealed later under a $N_2$ gas atmosphere.

An average film thickness of the copper oxide on the wire surface was measured through a depth analysis based on the Auger spectroscopy analysis. Particularly, the average film thickness of the copper oxide is an average value of a thickness of the copper oxide measured in at least three random locations on the wire surface. Here, Ar ion was used to sputter the wire surface so as to enable a measurement in a depth direction, and a unit of depth was expressed as a result of an $SiO_2$ conversion. An oxygen concentration of 30% by mass was regarded as a borderline between the copper oxide and the copper. Specifically, an oxygen concentration refers to a ratio of oxygen to a sum total of Cu, oxygen and metallic elements. SAM-670 (manufactured by PHI, type: FE) was used to carry out the measurement in which an accelerating voltage of an electron beam was set to be 5 kV, a field of measurement was 10 nA, and an Ar ion sputtering was performed with a an accelerating voltage of 3 kV and at a rate of 1 Columns titled "Copper oxide film thickness on wire surface" in Table 1 and Table 3 contain measurement results of the average film thickness of the copper oxide.

In this way, there were manufactured copper alloy bonding wires for semiconductor, as shown in the following Table 1 and Table 2.

TABLE 1

| | No. | Component concentration (% by mass) | | | | | | | Crystal grain average diameter μm | Copper oxide film thickness on wire surface (μm) | PCT reliability | | PCT reliability evaluation | | | |
|---|---|---|---|---|---|---|---|---|---|---|---|---|---|---|---|---|
| | | | | | | | | | | | | | 200 hours | | 500 hours | |
| | | Pd | Ag | Au | Ti | B | P | Cu | | | 200 hours | 500 hours | Shear strength | Variation | Shear strength | Variation |
| Working example | 1 | 0.13 | | | | | | Remainder | 7.4 | 0.005 | ⊚ | ○ | ⊚ | ⊚ | ○ | ⊚ |
| | 2 | 0.2 | | | | | | Remainder | 10.8 | 0.003 | ⊚ | ⊚ | ⊚ | ⊚ | ⊚ | ⊚ |
| | 3 | 0.5 | | | | | | Remainder | 4.3 | 0.007 | ⊚ | ⊚ | ⊚ | ⊚ | ⊚ | ⊚ |
| | 4 | 0.8 | | | | | | Remainder | 2.5 | 0.003 | ⊚ | ⊚ | ⊚ | ⊚ | ⊚ | ⊚ |
| | 5 | 1 | | | | | | Remainder | 5.2 | 0.001 | ⊚ | ⊚ | ⊚ | ⊚ | ⊚ | ⊚ |
| | 6 | 1.12 | | | | | | Remainder | 3.2 | 0.008 | ⊚ | ○ | ⊚ | ⊚ | ○ | ⊚ |
| | 7 | 1.15 | | | | | | Remainder | 2.3 | 0.006 | ⊚ | ○ | ⊚ | ⊚ | ○ | ⊚ |
| | 8 | 0.5 | | | | | | Remainder | 0.1 | 0.002 | ⊚ | ⊚ | ⊚ | ⊚ | ⊚ | ⊚ |
| | 9 | 0.9 | | | | | | Remainder | 1 | 0.006 | ⊚ | ⊚ | ⊚ | ⊚ | ⊚ | ⊚ |
| | 10 | 1.1 | | | | | | Remainder | 1.8 | 0.004 | ⊚ | ⊚ | ⊚ | ⊚ | ⊚ | ⊚ |
| | 11 | 0.5 | 0.0005 | | | | | Remainder | 2.3 | 0.002 | ⊚ | ⊚ | ⊚ | ⊚ | ⊚ | ⊚ |
| | 12 | 0.2 | 0.0008 | | | | | Remainder | 4.6 | 0.01 | ⊚ | ⊚ | ⊚ | ⊚ | ⊚ | ⊚ |
| | 13 | 0.6 | 0.001 | | | | | Remainder | 3.5 | 0.005 | ⊚ | ⊚ | ⊚ | ⊚ | ⊚ | ⊚ |
| | 14 | 0.8 | 0.003 | | | | | Remainder | 3.1 | 0.004 | ⊚ | ⊚ | ⊚ | ⊚ | ⊚ | ⊚ |
| | 15 | 0.5 | | 0.07 | | | | Remainder | 4.4 | 0.003 | ⊚ | ⊚ | ⊚ | ⊚ | ⊚ | ⊚ |
| | 16 | 0.15 | 0.02 | | | | | Remainder | 13.5 | 0.007 | ⊚ | ○ | ⊚ | ⊚ | ○ | ⊚ |
| | 17 | 0.6 | 0.07 | | | | | Remainder | 1.9 | 0.002 | ⊚ | ⊚ | ⊚ | ⊚ | ⊚ | ⊚ |
| | 18 | 0.7 | 0.0003 | 0.0005 | | | | Remainder | 8.3 | 0.005 | ⊚ | ⊚ | ⊚ | ⊚ | ⊚ | ⊚ |
| | 19 | 1.13 | 0.003 | 0.006 | | | | Remainder | 1.2 | 0.004 | ⊚ | ○ | ⊚ | ⊚ | ○ | ⊚ |
| | 20 | 0.8 | 0.05 | 0.015 | | | | Remainder | 2.5 | 0.005 | ⊚ | ⊚ | ⊚ | ⊚ | ⊚ | ⊚ |
| | 21 | 0.14 | | | 0.0008 | | | Remainder | 3.5 | 0.004 | ⊚ | ○ | ⊚ | ⊚ | ○ | ⊚ |
| | 22 | 0.8 | | | 0.006 | | | Remainder | 3.6 | 0.005 | ⊚ | ⊚ | ⊚ | ⊚ | ⊚ | ⊚ |
| | 23 | 0.2 | | | 0.01 | | | Remainder | 6.3 | 0.004 | ⊚ | ⊚ | ⊚ | ⊚ | ⊚ | ⊚ |
| | 24 | 0.2 | | | | 0.0005 | | Remainder | 8.4 | 0.006 | ⊚ | ⊚ | ⊚ | ⊚ | ⊚ | ⊚ |
| | 25 | 0.8 | | | | 0.001 | | Remainder | 2.5 | 0.003 | ⊚ | ⊚ | ⊚ | ⊚ | ⊚ | ⊚ |
| | 26 | 1.13 | | | | 0.003 | | Remainder | 2 | 0.004 | ⊚ | ○ | ⊚ | ⊚ | ○ | ⊚ |
| | 27 | 0.5 | | | | 0.006 | | Remainder | 1.7 | 0.005 | ⊚ | ⊚ | ⊚ | ⊚ | ⊚ | ⊚ |
| | 28 | 0.2 | | | | | 0.0006 | Remainder | 5.2 | 0.008 | ⊚ | ⊚ | ⊚ | ⊚ | ⊚ | ⊚ |
| | 29 | 0.8 | | | | | 0.005 | Remainder | 3.1 | 0.004 | ⊚ | ⊚ | ⊚ | ⊚ | ⊚ | ⊚ |
| | 30 | 0.7 | | | | | 0.019 | Remainder | 2.9 | 0.003 | ⊚ | ⊚ | ⊚ | ⊚ | ⊚ | ⊚ |
| | 31 | 0.5 | | | | 0.0006 | 0.0002 | Remainder | 5.4 | 0.004 | ⊚ | ⊚ | ⊚ | ⊚ | ⊚ | ⊚ |
| | 32 | 0.15 | | | 0.0002 | 0.001 | 0.001 | Remainder | 8.3 | 0.008 | ⊚ | ○ | ⊚ | ⊚ | ○ | ⊚ |
| | 33 | 1.1 | | | | 0.002 | 0.002 | Remainder | 2.4 | 0.002 | ⊚ | ⊚ | ⊚ | ⊚ | ⊚ | ⊚ |
| | 34 | 0.6 | | | 0.008 | | 0.01 | Remainder | 1.8 | 0.003 | ⊚ | ⊚ | ⊚ | ⊚ | ⊚ | ⊚ |
| | 35 | 0.3 | | | 0.005 | 0.003 | 0.015 | Remainder | 3.6 | 0.005 | ⊚ | ⊚ | ⊚ | ⊚ | ⊚ | ⊚ |
| | 36 | 1 | 0.001 | | | 0.001 | | Remainder | 1.9 | 0.004 | ⊚ | ⊚ | ⊚ | ⊚ | ⊚ | ⊚ |
| | 37 | 0.8 | | 0.0008 | | | 0.003 | Remainder | 3.3 | 0.004 | ⊚ | ⊚ | ⊚ | ⊚ | ⊚ | ⊚ |
| | 38 | 0.6 | 0.04 | | | 0.002 | 0.01 | Remainder | 3.9 | 0.005 | ⊚ | ⊚ | ⊚ | ⊚ | ⊚ | ⊚ |
| | 39 | 0.4 | 0.02 | 0.02 | 0.007 | 0.0005 | 0.01 | Remainder | 4.7 | 0.004 | ⊚ | ⊚ | ⊚ | ⊚ | ⊚ | ⊚ |
| | 40 | 0.2 | 0.06 | 0.01 | 0.01 | 0.002 | 0.008 | Remainder | 8.3 | 0.014 | ⊚ | ⊚ | ⊚ | ⊚ | ⊚ | ⊚ |
| | 41 | 1.13 | 0.0003 | | | | | Remainder | 2.2 | 0.006 | ⊚ | ○ | ⊚ | ⊚ | ○ | ⊚ |
| | 42 | 0.8 | | 0.0004 | | | | Remainder | 4.3 | 0.005 | ⊚ | ⊚ | ⊚ | ⊚ | ⊚ | ⊚ |
| | 43 | 0.3 | | 0.08 | | | | Remainder | 8.6 | 0.004 | ⊚ | ⊚ | ⊚ | ⊚ | ⊚ | ⊚ |
| | 44 | 0.6 | 0.03 | 0.05 | | | | Remainder | 3.8 | 0.004 | ⊚ | ⊚ | ⊚ | ⊚ | ⊚ | ⊚ |
| | 45 | 0.6 | | | 0.0003 | | | Remainder | 2.5 | 0.005 | ⊚ | ⊚ | ⊚ | ⊚ | ⊚ | ⊚ |
| | 46 | 0.7 | | | 0.0004 | | | Remainder | 4.6 | 0.003 | ⊚ | ⊚ | ⊚ | ⊚ | ⊚ | ⊚ |
| | 47 | 1 | | | | | 0.0003 | Remainder | 3.6 | 0.004 | ⊚ | ⊚ | ⊚ | ⊚ | ⊚ | ⊚ |
| | 48 | 0.5 | | | 0.015 | | | Remainder | 7.1 | 0.005 | ⊚ | ⊚ | ⊚ | ⊚ | ⊚ | ⊚ |
| | 49 | 0.4 | | | | 0.008 | | Remainder | 4.5 | 0.006 | ⊚ | ⊚ | ⊚ | ⊚ | ⊚ | ⊚ |
| | 50 | 0.3 | | | | | 0.022 | Remainder | 2.3 | 0.004 | ⊚ | ⊚ | ⊚ | ⊚ | ⊚ | ⊚ |
| Comparative example | 1 | 0.09 | | | | | | Remainder | 3.4 | 0.008 | X | X | X | X | X | X |
| | 2 | 0.12 | | | | | | Remainder | 0.15 | 0.007 | X | X | X | X | X | X |
| | 3 | 1.17 | | | | | | Remainder | 2.3 | 0.007 | X | X | X | X | X | X |
| | 4 | 1.2 | | 0.003 | 0.002 | | 0.001 | Remainder | 2.8 | 0.009 | X | X | X | X | X | X |
| | 5 | | 0.002 | | 0.001 | 0.002 | | Remainder | 3.5 | 0.015 | X | X | X | X | X | X |

TABLE 2

| No. | TCT reliability 25 μm | TCT reliability 18 μm | Ball bonding shape 25 μm | Ball bonding shape 18 μm | Wedge bondability (NSOL failure) 25 μm | Wedge bondability (NSOL failure) 18 μm | Loop control-height stability 25 μm | Loop control-height stability 18 μm | Shear strength | Trapezoidal loop linearity |
|---|---|---|---|---|---|---|---|---|---|---|
| Working example 1 | ○ | ○ | ○ | ○ | ◎ | ◎ | ◎ | ◎ | ○ | ○ |
| 2 | ○ | ○ | ○ | ○ | ◎ | ◎ | ◎ | ◎ | ○ | ○ |
| 3 | ○ | ○ | ○ | ○ | ◎ | ○ | ◎ | ○ | ○ | ○ |
| 4 | ○ | ○ | ○ | ○ | ◎ | ◎ | ◎ | ◎ | ○ | ○ |
| 5 | ○ | ○ | ○ | ○ | ◎ | ◎ | ◎ | ◎ | ○ | ○ |
| 6 | ○ | ○ | ○ | ○ | ◎ | ◎ | ◎ | ◎ | ○ | ○ |
| 7 | ○ | ○ | ○ | ○ | ◎ | ○ | ◎ | ○ | ○ | ○ |
| 8 | ○ | ○ | ○ | ○ | ○ | Δ | ○ | Δ | ○ | ○ |
| 9 | ○ | ○ | ○ | ○ | ○ | Δ | ○ | Δ | ○ | ○ |
| 10 | ○ | ○ | ○ | ○ | ○ | Δ | ○ | Δ | ○ | ○ |
| 11 | ○ | ○ | ◎ | ◎ | ◎ | ○ | ◎ | ○ | ○ | ○ |
| 12 | ○ | ○ | ◎ | ◎ | ◎ | ◎ | ◎ | ◎ | ○ | ○ |
| 13 | ○ | ○ | ◎ | ◎ | ◎ | ◎ | ◎ | ◎ | ○ | ○ |
| 14 | ○ | ○ | ◎ | ◎ | ◎ | ◎ | ◎ | ◎ | ○ | ○ |
| 15 | ○ | ○ | ◎ | ◎ | ◎ | ◎ | ◎ | ◎ | ○ | ○ |
| 16 | ○ | ○ | ◎ | ◎ | ◎ | ◎ | ◎ | ◎ | ○ | ○ |
| 17 | ○ | ○ | ◎ | ○ | ○ | Δ | ○ | Δ | ○ | ○ |
| 18 | ○ | ○ | ◎ | ◎ | ◎ | ◎ | ◎ | ◎ | ○ | ○ |
| 19 | ○ | ○ | ◎ | ○ | ○ | Δ | ○ | Δ | ○ | ○ |
| 20 | ○ | ○ | ◎ | ◎ | ◎ | ○ | ◎ | ○ | ○ | ○ |
| 21 | ◎ | ◎ | ○ | ○ | ◎ | ◎ | ◎ | ◎ | ○ | ○ |
| 22 | ◎ | ◎ | ○ | ○ | ◎ | ◎ | ◎ | ◎ | ○ | ○ |
| 23 | ◎ | ◎ | ○ | ○ | ◎ | ◎ | ◎ | ◎ | ○ | ○ |
| 24 | ◎ | ◎ | ○ | ○ | ◎ | ◎ | ◎ | ◎ | ○ | ○ |
| 25 | ◎ | ◎ | ○ | ○ | ◎ | ○ | ◎ | ○ | ○ | ○ |
| 26 | ◎ | ◎ | ○ | ○ | ◎ | ○ | ◎ | ○ | ○ | ○ |
| 27 | ◎ | ○ | ○ | ○ | ○ | Δ | ○ | Δ | ○ | ○ |
| 28 | ◎ | ◎ | ○ | ○ | ◎ | ◎ | ◎ | ◎ | ○ | ○ |
| 29 | ◎ | ◎ | ○ | ○ | ◎ | ◎ | ◎ | ◎ | ○ | ○ |
| 30 | ◎ | ◎ | ○ | ○ | ◎ | ○ | ◎ | ○ | ○ | ○ |
| 31 | ◎ | ◎ | ○ | ○ | ◎ | ◎ | ◎ | ◎ | ○ | ○ |
| 32 | ◎ | ◎ | ○ | ○ | ◎ | ◎ | ◎ | ◎ | ○ | ○ |
| 33 | ◎ | ◎ | ○ | ○ | ◎ | ○ | ◎ | ○ | ○ | ○ |
| 34 | ◎ | ○ | ○ | ○ | ○ | Δ | ○ | Δ | ○ | ○ |
| 35 | ◎ | ◎ | ○ | ○ | ◎ | ◎ | ◎ | ◎ | ○ | ○ |
| 36 | ◎ | ○ | ◎ | ○ | ○ | Δ | ○ | Δ | ○ | ○ |
| 37 | ◎ | ◎ | ◎ | ◎ | ◎ | ◎ | ◎ | ◎ | ○ | ○ |
| 38 | ◎ | ◎ | ◎ | ◎ | ◎ | ◎ | ◎ | ◎ | ○ | ○ |
| 39 | ◎ | ◎ | ◎ | ◎ | ◎ | ◎ | ◎ | ◎ | ○ | ○ |
| 40 | ◎ | ◎ | ◎ | ◎ | ◎ | ◎ | ◎ | ◎ | ○ | ○ |
| 41 | ○ | Δ | ○ | ○ | ◎ | ○ | ◎ | ○ | ○ | ○ |
| 42 | ○ | Δ | ○ | ○ | ◎ | ◎ | ◎ | ◎ | ○ | ○ |
| 43 | ○ | Δ | ○ | ○ | ◎ | ◎ | ◎ | ◎ | Δ | ○ |
| 44 | ○ | Δ | ○ | ○ | ◎ | ◎ | ◎ | ◎ | Δ | ○ |
| 45 | ○ | Δ | ○ | ○ | ◎ | ○ | ◎ | ○ | ○ | ○ |
| 46 | ○ | Δ | ○ | ○ | ◎ | ◎ | ◎ | ◎ | ○ | ○ |
| 47 | ○ | Δ | ○ | ○ | ◎ | ◎ | ◎ | ◎ | ○ | ○ |
| 48 | ○ | Δ | ○ | ○ | ◎ | ◎ | ◎ | ◎ | ○ | Δ |
| 49 | ○ | Δ | ○ | ○ | ◎ | ◎ | ◎ | ◎ | ○ | Δ |
| 50 | ○ | Δ | ○ | ○ | ◎ | ○ | ◎ | ○ | ○ | Δ |
| Comparative example 1 | Δ | Δ | ○ | ○ | ○ | ○ | ○ | ○ | ○ | ○ |
| 2 | Δ | Δ | ○ | ○ | ○ | ○ | ○ | ○ | ○ | ○ |
| 3 | Δ | Δ | ○ | ○ | ○ | ○ | ○ | ○ | X | ○ |
| 4 | Δ | Δ | ○ | ○ | ○ | ○ | ○ | ○ | X | ○ |
| 5 | Δ | Δ | ○ | ○ | ○ | ○ | ○ | ○ | ○ | ○ |

A general automatic wire bonding device manufactured by ASM was then employed to perform a ball/wedge bonding, using the aforementioned copper alloy bonding wire for semiconductor. Ball bonding was performed as follows. A ball was formed on a front end of the wire through arc discharge, followed by bonding the ball thus formed to an electrode film through a type of thermocompression bonding method featuring ultrasound. The ball was actually formed with the frond end of the wire being subjected to an inert gas, thus controlling oxidation of a melting copper alloy bonding wire for semiconductor An $N_2+5\%$ $H_2$ gas was used as an inert gas.

The ball was actually bonded to an Al alloy film (Al—1% Si—0.5% Cu) having a thickness of about 0.8 to 3 μm, such Al alloy film being a material forming an electrode film on a silicon substrate. Here, it was confirmed that substantially similar results could be obtained even when there was used an Al alloy film of Al—0.5% Cu. The wire was further wedge-bonded to a lead frame whose surface is plated with Ag (thickness: 2 to 4 μm). Differences between examples and comparative examples were confirmed even when there was used a glass epoxy resin substrate on which an Au and Ni plated Cu trace was formed.

There were performed the following reliability evaluation tests on the copper alloy bonding wire for semiconductor. Here, the wire diameter was set to be 18 μm. Further, a diameter of a press-bonded ball was set to be 32 μm, and a bonding temperature was set to be 175° C. The press-bonded ball was actually bonded to the Al alloy film of Al—0.5% Cu having a thickness of 1 µm. A wire-bonded sample was then encapsulated using a green general encapsulation resin that was free from a halogen such Br (bromine) or the like. Here, an analytical concentration of chlorine contained in the encapsulation resin was 3 to 8 ppm by mass, such chlorine being a typical impurity found in the encapsulation resin.

There was performed a PCT test (pressure cooker test) in which a sample with 40 copper alloy bonding wires for semiconductor bonded thereto was heated in a high temperature and high humidity environment for 200 or 500 hours. Specifically, the corresponding sample was heated under a saturation condition in which a temperature was 121° C., a relative humidity was 100% and a pressure was 2 atmospheres. Subsequently, there were evaluated electric properties of the 40 copper alloy bonding wires for semiconductor that were bonded to the sample. Crosses in a column titled "PCT reliability" in Table 1 represent a poor bonding condition in which 30% or more (a percentage of the 40 wires, as in this test) of the copper alloy bonding wires for semiconductor had had electric resistances thereof tripled or more as compared to initial values. Triangles in the column titled "PCT reliability" in Table 1 represent a condition in which the percentage of the copper alloy bonding wires for semiconductor that had had the electric resistances thereof tripled or more was not less than 5%, but less than 30%. Specifically, the wires rated as "triangle" could be used in IC chips manufactured under less strict reliability requirements. Circles in the column titled "PCT reliability" in Table 1 represent a practical issue-free condition in which less than 5% of the copper alloy bonding wires for semiconductor had had the electric resistances thereof tripled or more, and in which a percentage of the copper alloy bonding wires for semiconductor that had had the electric resistances thereof multiplied by 1.5 or more was not less than 5%, but less than 30%. Double circles in the column titled "PCT reliability" in Table 1 represent a favorable condition in which less than 5% of the bonding wires had had the electric resistances thereof multiplied by 1.5 or more.

After being heated for 200 or 500 hours in the PCT test, there were evaluated shear strengths of ball-bonded portions of 100 copper alloy bonding wires for semiconductor. Evaluations of the shear strengths were then listed in a column titled "Shear strength" under both "200 hours" and "500 hours" of "PCT reliability evaluation" in Table 1. Specifically, there is listed a ratio of an average value of a shear strength after the PCT test to an average value of an initial shear strength prior to the heat treatment. Here, crosses represent a condition in which the corresponding ratio was less than 40%. The wires rated as "cross" were thus defective in terms of reliability. Triangles represent a condition in which the aforementioned ratio was not less than 40%, but less than 60%. The wires rated as "triangle" could be used in IC chips manufactured under less strict reliability requirements. Circles represent a practical issue-free condition in which the aforementioned ratio was not less than 60%, but less than 80%. Double circles represent a favorable condition in terms of PCT reliability, in which the aforementioned ratio was not less than 80%.

Further, there was evaluated a variation in PCT reliabilities. Specifically, there was evaluated a ratio (%) of standard deviation to the average value of a shear strength after the PCT test. Evaluation results thereof are listed in a column titled "Variation" under both "200 hours" and "500 hours" of "PCT reliability evaluation" in Table 1. Here, crosses indicate that the standard deviation ratio was not less than 9%. The wires rated as "cross" exhibited large variations in their strengths, thus being practically problematic. Triangles indicate that the standard deviation ratio was not less than 6%, but less than 9%. Although the wires rated as "triangle" were preferably improved, they could be used in IC chips manufactured under less strict reliability requirements. Circles indicate that the standard deviation ratio was not less than 4%, but less than 6%. The wires rated as "circle" bore no immediate problem in terms of practical use. Double circles indicate that the standard deviation ratio was not less than 0%, but less than 4%. The wires rated as "double circle" had stable PCT reliabilities and were superior in terms of mass productivity.

A commercially available TCT test device was used to perform a TCT test. Particularly, a sample with 400 copper alloy bonding wires for semiconductor bonded thereto, was subjected, in advance, to a test featuring an extreme temperature history (−55° C./30 min to 155° C./30 min). After the corresponding test, electrical measurements were performed on the 400 copper alloy bonding wires for semiconductor that were bonded to the sample, so as to evaluate electric conductivities of the wires. Evaluation results thereof are listed in a column titled "TCT reliability" in Table 2. Here, double circles represent a highly reliable condition in which a defective fraction was zero. Circles indicate that the defective fraction was less than 2%. The wires rated as "circle" thus boar no significant problem in terms of practical use. Triangles indicate that the defective fraction was 2 to 5%. Crosses represent a condition requiring improvement, in which the detective fraction was greater than 5%.

Other than the aforementioned reliability evaluation, there were also performed the following wire-performance evaluation tests.

As many as 200 press-bonded balls were observed so as to discriminate shapes thereof from one another. Particularly, evaluations were based on criteria including roundness, excessive deformation failure, dimension accuracy and so on. Further, there were used two types of wires including a wire having a wire diameter of 25 µm and a wire having a wire diameter of 1.8 µm. Evaluation results are listed in a column titled "ball-bonded shape" in Table 2. Here, crosses represent a defective condition in which there were observed six or more press-bonded balls having a defective ball shape such as a petal shape, an anisotropic shape deviated from a shape of a true circle, or the like. Further, there were given two types of evaluations including "triangle" and "circle," when there were observed one to five press-bonded balls having the defective ball shape such as the anisotropic shape, the petal shape or the like. Specifically, triangles indicate that one or more press-bonded balls exhibited an excessive deformation failure such as noticeable core deviation or the like. The wires rated as "triangle" were preferably improved in terms of mass productivity. Meanwhile, circles represent a usable condition in which the excessive deformation failure was not observed. Double circles represent a favorable condition in which none of the press-bonded balls had the defective ball shape.

A ball bonding strength was evaluated as follows. There was used a sample with the wires of 25 µm bonded thereto at a stage temperature of 175° C., such stage temperature causing ball diameters to be as large as 50 to 65 µm. A shear test was performed on ball-bonded portions of 20 of the aforementioned wires, so as to measure an average value of a shear strength thereof. The average value of the shear strength thus measured and an average value of an area of the ball-bonded portion, was then used to calculate a shear strength per unit area. Evaluation results of the shear strength thus calculated are listed in a column titled "Shear strength" in Table 2. Here, crosses represent a condition of an insufficient bonding strength, in which the shear strength per unit area was less than 70 MPa. Triangles indicate that the shear strength per unit area was not less than 70 MPa, but less than 90 MPa. The wires rated as "triangle" could actually be improved through a slight change in the bonding condition. Circles represent a practical issue-free condition in which the shear strength per unit area was not less than 90 MPa, but less than 110 MPa. Double circles represent a favorable condition in which the shear strength per unit area was not less than 110 MPa.

A wedge bondability was evaluated as follows. Specifically, there was performed an acceleration test in which the wires were bonded at a low temperature and with a low load, such low temperature and low load contributing to detachment failures. The bonding temperature was set to be 160° C., and the wires were bonded to a Cu lead frame plated with Ag. Here, there were actually used two types of the copper alloy bonding wires for semiconductor, including the wire having the wire diameter of 25 µm and the wire having the wire diameter of 18 µm. Specifically, there was evaluated a frequency of occurrence of non-stick failures (Non-Stick-On-Lead: NSOL) of 2000 wires bonded. Evaluation results thereof are listed in a column titled "Wedge bondability" in Table 2. Here, crosses represent a condition requiring improvement, in which a number of non-sticking wires was not less than six. Triangles indicate that the number of the non-sticking wires was three to five Circles represent a substantially favorable condition in which the number of the non-sticking wires was either one or two. Double circles indicate that the number of the non-sticking wires was zero. The wires rated as "double circle" had favorable wire storage lives.

A stability of a loop shape during a bonding procedure was evaluated as follows. Specifically, there were manufactured 500 loops, including those manufactured with a tong wire span of 4 mm and those manufactured with a general wire span of 2 mm. A projector was then used to observe the loops thus manufactured so as to evaluate a variation in loop heights of the copper alloy bonding wires for semiconductor, wire bending failures thereof, and so on. Here, there were used two types of the copper alloy bonding wire for semiconductor, including the wire having the wire diameter of 25 µm and the wire having the wire diameter of 18 µm. A stricter manner of loop control was required when forming a trapezoidal loop with the long wire span of 4 mm, so that a contact with a chip edge could be avoided. Evaluation results are listed in a column titled "Loop control-height stability" in Table 2. Here, crosses represent a problematic condition in which five or more loops manufactured with the wire span of 2 mm exhibited failures in terms of linearity and loop height. Triangles represent a condition requiring improvement, in which failures were observed in two to four loops manufactured with the wire span of 2 mm, and in five or more loops manufactured with the long wire span of 4 mm. Circles represent a relatively favorable condition in which failures were observed in not more than one loop manufactured with the wire span of 2 mm, and in two to four loops manufactured with the long wire span of 4 mm. Double circles represent a loop shape stable condition in which failures were observed in not more than one loop manufactured with the long wire span of 4 mm.

The linearity of the trapezoidal loop was evaluated as follows. Specifically, the wires evaluated were bonded with the tong wire span of 4 mm, and had the wire diameter of 25 µm. As many as 30 copper alloy bonding wires for semiconductor were then observed from above through the projector, so as to measure a bending degree of the corresponding wires. Particularly, the bending degree refers to a degree at which each copper alloy bonding wire for semiconductor was most deviated from a straight line connecting the ball-bonded portion with a wedge-bonded portion. Evaluation results are listed in a column titled "Trapezoidal loop linearity" in Table 2. Here, double circles represent a favorable condition in which an average bending degree was less than the wire diameter. Triangles represent a condition requiring improvement, in which the average bending degree was equivalent to a sum of two wire diameters or larger. Circles represent a condition that is ordinarily problem-free and is intermediate between the condition represented by the double circles and the condition represented by the triangles.

According to Table 1 and Table 2, a type of copper alloy bonding wire for semiconductor as set forth in claim 1 was used in working examples 1 through 50. A type of copper alloy bonding wire for semiconductor as set forth in claim 3 was used in the working examples 1 through 7, 11 through 16, 18, 20 through 26, 28 through 33, 35 and 37 through 50. A type of copper alloy bonding wire for semiconductor as set forth in claim 4 was used in the working examples 11 through 20 and the working examples 36 through 40. A type of copper alloy bonding wire for semiconductor as set forth in claim 5 was used in the working examples 21 through 40. Further, comparative examples 1 through 4 used copper alloy bonding wires for semiconductor that failed to fulfill the conditions as set forth in claim 1.

The type of copper alloy bonding wire for semiconductor as set forth in claim 1 was used in the working examples 1 through 50. It was confirmed that a bonding wires containing 0.13 to 1.15% by mass of Pd had exhibited a favorable PCT reliability after being heated for 200 hours. However, each bonding wire used in the comparative examples 1 through 5 did not contain 0.13 to 1.15% by mass of Pd, and exhibited a lowered PCT reliability even after being heated for as short as 200 hours. Each one of copper alloy bonding wires for semiconductor used in the working examples 2 through 5, 8 through 15, 17, 18, 20, 22 through 25, 27 through 31, 33 through 40 and 42 through 50, contained 0.2 to 1.1% by mass of Pd, and therefore exhibited a favorable PCT reliability after being heated for 500 hours.

The type of copper alloy bonding wire for semiconductor as set forth in claim 3 was used in the working examples 1 through 7, 11 through 16, 18, 20 through 26, 28 through 33, 35 and 37 through 50. Each one of bonding wires used in those working examples contained 0.13 to 1.15% by mass of Pd, and had crystal grains not smaller than 2 µm on average on a wire cross-section surface parallel to a wire longitudinal direction. The bonding wires used in the corresponding working examples also exhibited favorable loop height stabilities and wedge bondabilities. Meanwhile, each bonding wire used in the working examples 8 through 10, 17, 19, 27, 34 and 36, did not have crystal grains not smaller than 2 µm on average, but exhibited a slightly lowered, though allowable, loop height stability and wedge bondability. Each one of copper alloy bonding wires for semiconductor used in the working examples 1 through 3, 5, 6, 12 through 16, 18, 21 through 24, 28, 29, 31, 32, 35, 37 through 40, 42 through 44 and 46 through 49, had crystal grains not smaller than 3 µm on average, and therefore exhibited a further improved loop height stability and wedge bondability.

The type of copper alloy bonding wire for semiconductor as set forth in claim 4 was used in the working examples 11 through 20 and the working examples 36 through 40. Each one of bonding wires used in the corresponding working examples contained 0.13 to 1.15% by mass of Pd and at least one of Ag and Au in a total amount of 0.0005 to 0.07% by mass, thus allowing there to be formed a favorable ball-bonded shape when a wire diameter thereof was 25 μm. Particularly, each copper alloy bonding wire used in the working examples 11 through 16, 18 and 37 through 40 contained 0.13 to 1.15% by mass of Pd and at least one of Ag and Au in a total amount of 0.0005 to 0.07% by mass, had crystal grains not smaller than 2 μm on average, thus allowing there to be formed a favorable ball-bonded shape even under a severe condition in which a wire diameter was as thin as 18 μm.

The type of copper alloy bonding wire for semiconductor as set forth in claim 5 was used in the working examples 21 through 40. Each bonding wire used in the working examples 21 through 40 contained 0.13 to 1.15% by mass of Pd, and at least one of Ti: 0.0005 to 0.01% by mass, B: 0.0005 to 0.007% by mass and P: 0.0005 to 0.02% by mass. Here, a sum total of at least one of such Ti, B and P accounted for 0.0005 to 0.025% by mass, and each bonding wire used in the working examples 21 through 40 exhibited a favorable TCT reliability when a wire diameter thereof was 25 μm. Particularly, each copper alloy bonding wire for semiconductor used in the working examples 21 through 26, 28 through 33, 35, 37 through 40 had crystal grains not smaller than 2 μm on average, and exhibited a favorable TCT reliability even under the sever condition in which a wire diameter was as thin as 18 μm.

bonding wires that had copper oxide film thicknesses thereof modified through, for example, a modified manufacturing condition. The thicknesses of the oxide films were easily controlled by controlling: a heating temperature applied in the heat treatment in which the wire diameter of each bonding wire had already reached the final wire diameter; the rate at which the nitrogen gas was flowed; the rates at which the boning wires were moved; the oxygen concentration in the furnace, and so on. A type of copper alloy bonding wire for semiconductor as set forth in claim 2 was used in the working examples 1 through 50 as shown in Table 1 and Table 2, and working examples 2a, 2c, 3a, 3h, 4a, 4h, 4c, 6a, 6b, 14a, 14h, 24a, 24b, 29a and 29h as shown in Table 3. Working examples 1a, 1b used copper alloy bonding wires for semiconductor that failed to fulfill the conditions as set forth in claim 1.

The type of copper alloy bonding wire for semiconductor as set forth in claim 2 was used in the working examples 2a, 2c, 3a, 3b, 4a, 4b, 4c, 6a, 6b, 14a, 14b, 24a, 24b, 29a and 29 h. Each bonding wire used in the corresponding working examples contained 0.13 to 1.15% by mass of Pd and had the copper oxide formed on the surface thereof with an average film thickness of 0.0005 to 0.02 μm, thereby reducing the variation in PCT reliabilities and achieving a stabilized result accordingly.

The invention claimed is:

1. A copper alloy bonding wire for semiconductor manufactured by wire drawing of a copper alloy, the copper alloy consisting of 0.13 to 1.15% by mass of Pd, and a remainder consisting of copper,

TABLE 3

| No. | | Copper oxide film thickness on wire surface μm | Heat treatment condition (Final wire diameter) | | | | PCT wire diameter μm | Reliability evaluation | | | |
|---|---|---|---|---|---|---|---|---|---|---|---|
| | | | Heating temperature °C. | Gas flow rate (L/min) | Rate (m/min) | Oxygen concentration (%) | | 200 hours | | 500 hours | |
| | | | | | | | | Bonding strength | Variation | Bonding strength | Variation |
| Working example | 2a | 0.003 | 450 | 3 | 70 | 2 | 18 | ◉ | ◉ | ◉ | ◉ |
| | 2b | 0.0003 | 250 | 5 | 60 | 0.5 | 18 | ◉ | Δ | ◉ | Δ |
| | 2c | 0.015 | 500 | 1 | 40 | 5 | 18 | ◉ | ◉ | ◉ | ◉ |
| | 3a | 0.007 | 550 | 3 | 60 | 3 | 18 | ◉ | ◉ | ◉ | ◉ |
| | 3b | 0.02 | 750 | 1 | 30 | 6 | 18 | ◉ | ◉ | ◉ | ◉ |
| | 4a | 0.003 | 450 | 3 | 40 | 1 | 18 | ◉ | ◉ | ◉ | ◉ |
| | 4b | 0.0005 | 300 | 2 | 70 | 0.8 | 18 | ◉ | ◉ | ◉ | ◉ |
| | 4c | 0.01 | 600 | 2 | 60 | 4 | 18 | ◉ | ◉ | ◉ | ◉ |
| | 4d | 0.022 | 800 | 1 | 20 | 8 | 18 | ◉ | Δ | ◉ | Δ |
| | 6a | 0.008 | 600 | 3 | 50 | 3 | 18 | ◉ | ◉ | ◉ | ◉ |
| | 6b | 0.017 | 700 | 1 | 60 | 5 | 18 | ◉ | ○ | ◉ | ○ |
| | 14a | 0.004 | 500 | 3 | 80 | 3 | 18 | ◉ | ◉ | ◉ | ◉ |
| | 14b | 0.01 | 550 | 2 | 40 | 4 | 18 | ◉ | ◉ | ◉ | ◉ |
| | 24a | 0.006 | 500 | 3 | 70 | 3 | 18 | ◉ | ◉ | ◉ | ◉ |
| | 24b | 0.002 | 400 | 4 | 60 | 2 | 18 | ◉ | ◉ | ◉ | ◉ |
| | 29a | 0.004 | 450 | 3 | 60 | 2 | 18 | ◉ | ◉ | ◉ | ◉ |
| | 29b | 0.016 | 750 | 1 | 40 | 3 | 18 | ◉ | ○ | ◉ | ○ |
| Comparative example | 1a | 0.005 | 400 | 3 | 50 | 3 | 18 | X | — | X | — |
| | 1b | 0.015 | 450 | 1 | 40 | 7 | 18 | X | — | X | — |

Table 3 shows evaluation results regarding controlled film thicknesses of the copper oxide formed on the copper alloy bonding wires for semiconductor. There were controlled and modified the film thicknesses of the copper oxide formed on the bonding wires of the working examples in Table 1. Here, sample numbers with "a" in the end represent the bonding wires evaluated in the working examples in Table 1, whereas sample numbers with "b," "c" or "d" in the end represent wherein a copper oxide formed on a surface of the copper alloy bonding wire has an average film thickness of 0.0005 to 0.02 μm.

2. The copper alloy bonding wire for semiconductor according to claim 1, comprising:

crystal grains not smaller than 2 μm and not larger than a wire diameter multiplied by 1.5 on average, said crystal grains being observed on a wire cross-section surface parallel to a wire longitudinal direction.

3. A copper alloy bonding wire for semiconductor manufactured by wire drawing of a copper alloy, the copper alloy consisting of 0.13 to 1.15% by mass of Pd, at least one of Ag and Au in a total amount of 0.0005 to 0.07% by mass, and a remainder consisting of copper,
wherein a copper oxide formed on a surface of the copper alloy bonding wire has an average film thickness of 0.0005 to 0.02 µm.

4. A copper alloy bonding wire for semiconductor manufactured by wire drawing of a copper alloy, the copper alloy consisting of more than 0.5% and not more than 1.15% by mass of Pd, at least one of Ti: 0.0005 to 0.01% by mass and B: 0.0005 to 0.007% by mass, and a remainder consisting of copper,
wherein a copper oxide formed on a surface of the copper alloy bonding wire has an average film thickness of 0.0005 to 0.02 µm.

5. A copper alloy bonding wire for semiconductor manufactured by wire drawing of a copper alloy, the copper alloy consisting of more than 0.5% and not more than 1.15% by mass of Pd, at least one of Ag and Au in a total amount of 0.0005 to 0.07% by mass, at least one of Ti: 0.0005 to 0.01% by mass and B: 0.0005 to 0.007% by mass, and a remainder consisting essentially of copper,
wherein a copper oxide formed on a surface of the copper alloy bonding wire has an average film thickness of 0.0005 to 0.02 µm.

6. The copper alloy bonding wire for semiconductor according to claim 3, comprising crystal grains not smaller than 2 µm and not larger than a wire diameter multiplied by 1.5 on average, said crystal grains being observed on a wire cross-section surface parallel to a wire longitudinal direction.

7. The copper alloy bonding wire for semiconductor according to claim 4, comprising: crystal grains not smaller than 2 µm and not larger than a wire diameter multiplied by 1.5 on average, said crystal grains being observed on a wire cross-section surface parallel to a wire longitudinal direction.

8. The copper alloy bonding wire for semiconductor according to claim 5, comprising: crystal grains not smaller than 2 µm and not larger than a wire diameter multiplied by 1.5 on average, said crystal grains being observed on a wire cross-section surface parallel to a wire longitudinal direction.

* * * * *